United States Patent
Muthiyalu et al.

(10) Patent No.: US 11,481,294 B2
(45) Date of Patent: Oct. 25, 2022

(54) RUNTIME CELL ROW REPLACEMENT IN A MEMORY

(71) Applicant: INTEL CORPORATION, Santa Clara, CA (US)

(72) Inventors: Satish Muthiyalu, Bangalore (IN); Yingwen Chen, Shanghai (CN); Yu Yu, Shanghai (CN); Tao Xu, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/262,696

(22) PCT Filed: Sep. 15, 2018

(86) PCT No.: PCT/CN2018/105882
§ 371 (c)(1),
(2) Date: Jan. 22, 2021

(87) PCT Pub. No.: WO2020/051921
PCT Pub. Date: Mar. 19, 2020

(65) Prior Publication Data
US 2021/0191829 A1    Jun. 24, 2021

(51) Int. Cl.
*G06F 11/20* (2006.01)
*G11C 29/00* (2006.01)
(Continued)

(52) U.S. Cl.
CPC ...... *G06F 11/2094* (2013.01); *G06F 11/1666* (2013.01); *G06F 13/24* (2013.01);
(Continued)

(58) Field of Classification Search
CPC .. G06F 11/2094; G06F 13/24; G06F 2201/85; G06F 11/1666; G11C 29/74;
(Continued)

(56) References Cited

U.S. PATENT DOCUMENTS 5,263,032 A * 11/1993 Porter ................... G06F 11/106
714/764
5,664,195 A * 9/1997 Chatterji ............... G06F 9/4411
719/321
(Continued)

FOREIGN PATENT DOCUMENTS

CN      103116551 B    5/2013
WO      0245094 A2     6/2002
(Continued)

OTHER PUBLICATIONS

International Search Report and Written Opinion for International Application No. PCT/CN2018/105882, dated Jun. 17, 2019, 9 pp. [(ISR & WO)].
(Continued)

*Primary Examiner* — John J Tabone, Jr.
(74) *Attorney, Agent, or Firm* — Compass IP Law, PC

(57) ABSTRACT

Runtime memory cell row defect detection and replacement includes detecting in a memory of a computer system operating in a runtime operating system mode, a defective row of memory cells having at least one defective cell. In response to the detection of the defective row, interrupting the operating system of the computer system and, in a runtime system maintenance mode, replacing the defective row of memory cells with a spare row of memory cells as a replacement row of memory cells. Execution of the operating system is then resumed in the runtime operating system mode Other aspects and advantages are described.

18 Claims, 5 Drawing Sheets

(51) Int. Cl.
*G06F 13/24* (2006.01)
*G06F 11/16* (2006.01)
*G11C 29/44* (2006.01)

(52) U.S. Cl.
CPC .......... *G11C 29/4401* (2013.01); *G11C 29/72* (2013.01); *G11C 29/74* (2013.01); *G11C 29/808* (2013.01); *G11C 29/814* (2013.01); *G06F 2201/85* (2013.01)

(58) Field of Classification Search
CPC ..... G11C 29/814; G11C 29/808; G11C 29/72; G11C 29/4401
USPC .................. 714/711, 710, 718; 365/200, 201
See application file for complete search history.

(56) References Cited

U.S. PATENT DOCUMENTS

| | | | | |
|---|---|---|---|---|
| 7,987,332 | B2* | 7/2011 | Traister | G11C 16/10 711/167 |
| 9,564,245 | B2* | 2/2017 | Querbach | G11C 29/4401 |
| 9,704,601 | B2* | 7/2017 | Oh | G11C 29/70 |
| 10,049,010 | B2 | 8/2018 | Yang et al. | |
| 10,468,118 | B2* | 11/2019 | Walton | G11C 29/78 |
| 10,635,350 | B2* | 4/2020 | Singhal | G06F 3/0679 |
| 10,956,202 | B1* | 3/2021 | Sicron | G06F 3/0647 |
| 2004/0260983 | A1* | 12/2004 | Leung | G06F 13/4077 711/E12.086 |
| 2012/0221905 | A1* | 8/2012 | Burger | G06F 11/0793 714/E11.159 |
| 2014/0211579 | A1* | 7/2014 | Lovelace | G11C 29/028 365/200 |
| 2015/0187439 | A1* | 7/2015 | Querbach | G06F 11/263 714/719 |
| 2016/0062819 | A1* | 3/2016 | Oh | G11C 29/70 714/6.11 |
| 2017/0169905 | A1* | 6/2017 | Walton | G06F 11/1048 |
| 2018/0113648 | A1* | 4/2018 | Brandl | G06F 11/1048 |
| 2019/0227742 | A1* | 7/2019 | Singhal | G06F 3/068 |
| 2019/0286341 | A1 | 9/2019 | Hou et al. | |

FOREIGN PATENT DOCUMENTS

WO 2015074235 A1 5/2015
WO 2018103592 A1 6/2018

OTHER PUBLICATIONS

Nguyen, K.T., "New Reliability, Availability, and Serviceability (RAS) Features in the Intel Xeon Processor Family", [online], dated Jun. 20, 2017, [Retrieved on Aug. 11, 2018], retrieved from the Internet at <URL: https://software.intel.com/en-us/articles/new-reliability-availability-and-serviceability-ras-f . . . >, 5 pp.

Sridharan, V., et al., "Memory Errors in Modern Systems: The Good, The Bad, and The Ugly", ASPLOS '15: Proceedings of the Twentieth International Conference on Architectural Support for Programming Languages and Operating Systems, Mar. 2015, 14 pp.

Wikipedia, "Booting", [online], last edited on Jul. 18, 2018, Retrieved from the Internet at <URL: https://en.wikipedia.org/w/index.php?title=Booting&oldid=850910386>, 12 pp.

Wikipedia, "Lockstep (computing)", [online], last edited on Apr. 20, 2018, Retrieved from the Internet at <URL https://en.wikipedia.org/w/index.php?title=Lockstep_(computing)&oldid=837378404#MEMORY>, 2 pp.

Wikipedia, "P-Code Machine", [online], last edited on May 12, 2018, Retrieved from the Internet at <URL: https://en.wikipedia.org/w/index.php?title=P-code_machine&oldid=840876237>, 6 pp.

International Preliminary Report on Patentability for PCT Patent Application No. PCT/CN2018/105882, dated Mar. 9, 2021, 4 pages.

* cited by examiner

RUNTIME CELL ROW REPLACEMENT IN A MEMORY

CLAIM OF PRIORITY

This application is a U.S. National Phase application under 35 U.S.C. § 371 of International Application No. PCT/CN2018/105882 filed Sep. 15, 2018, entitled "RUNTIME CELL ROW REPLACEMENT IN A MEMORY," which is incorporated in its entirety herewith.

BACKGROUND

A known repair process referred to herein as Post Package Repair (PPR) is employed in repairing a single row of memory cells in a Bank Group (BG) memory region of a double data rate fourth generation (DDR4) and subsequent generation dynamic random access memory (DRAM) devices. Upon detection of a row of memory cells having one or more defective memory cells, the row address to the defective row may be remapped to a spare, that is, previously unused row of memory cells. Thus, read or write operations which would have been directed to the defective row are instead redirected to the spare row of memory cells which takes the place of the defective row of memory cells as a replacement row of memory cells. In this manner, the defective row of memory cells in the DRAM is "repaired."

One known Post Package Repair has two modes: soft Post Package Repair (sPPR) and hard Post Package Repair (hPPR). Soft Post Package Repair (sPPR) provides for quickly, but temporarily, repairing a row element in a Bank Group (BG). In contrast, a hard Post Package repair takes significantly longer than a soft Post Package Repair but is permanent.

A Post Package Repair may be undertaken in the latter stages of the manufacturing process to improve the yield of properly functioning devices after completion of the repairs. However, to provide for repair of a defective row of memory cells detected during execution of the operating system and user applications, the Basic Input/Output System (BIOS) may be programmed to initiate a Post Package Repair the next time the computer system employing the DRAM is booted or rebooted.

A memory controller controlling a memory module may be designed to detect a defective row of memory cells and store the row address of the defective row in a register. Upon the next reboot of the system, the BIOS requests the memory controller to command the appropriate memory module to undertake the Post Package Repair to substitute a properly operating spare row for the defective row.

Another known memory repair is referred to as Adaptive DRAM Double Device Correction (ADDDC) which uses an error correction code (ECC) region to replace a faulty memory device or devices such as a bank (e.g. a DRAM chip) or a rank (e.g. a set of DRAM chips). To allow recovery from bit errors, data may be stored in an encoded form in a memory, in which an error correction code (ECC) is used to encode the data. ECC encoded data is frequently stored in a designated ECC memory region and may be employed to remove the errors and reconstruct the original data.

ADDDC replaces a faulty memory device using an ECC memory region which was previously designated for storing ECC encoded data. An ADDDC repair is performed during runtime in which the central processing unit (CPU) of the computer system employing the memory is controlled by the operating system and user applications instead of during a system boot or reboot in which the CPU is controlled by the BIOS.

BRIEF DESCRIPTION OF THE DRAWINGS

Referring now to the drawings in which like reference numbers represent corresponding parts throughout:

FIG. 6 depicts an example of operations of the memory of FIG. 3 during runtime of the processor logic of FIG. 2.

DETAILED DESCRIPTION

Figure 1:
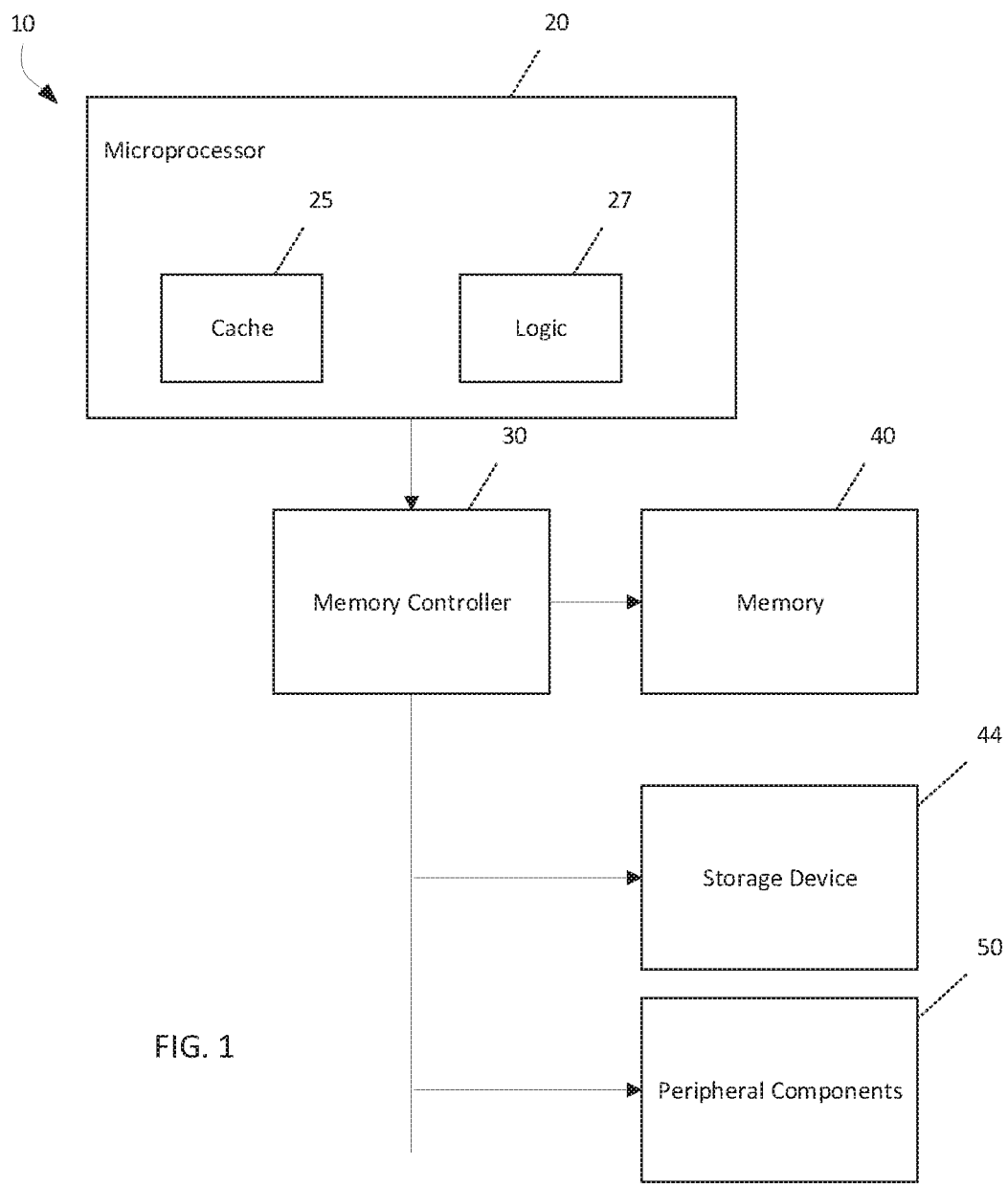
FIG. 1 illustrates a block diagram of a computing environment employing runtime cell row replacement in accordance with certain embodiments.

In the following description, reference is made to the accompanying drawings which form a part hereof and which illustrate several embodiments. It is understood that other embodiments may be utilized and structural and operational changes may be made.

Runtime cell row replacement in accordance with the present description is directed to repairing as few as a single row of memory during runtime of the computer system without waiting for a subsequent boot or reboot of the system to accomplish the repair. In addition, such repair may be accomplished without using ECC memory and thus without any impact upon ECC error correction of bit errors. In this manner, runtime cell row replacement in accordance with the present description provides a significant improvement in computer technology.

Since a known Post Package Repair waits until the next boot time to perform a row repair, it is appreciated herein that more and more correctable errors might accumulate prior to the next boot time and to a degree which becomes uncorrectable. If so, the system crash rate may increase and the system service time consequently decrease. In contrast, by repairing as few as a single row of memory at a time during runtime of the computer system without waiting for a subsequent boot or reboot of the system to accomplish the repair, a defective row detected during runtime may be repaired immediately without waiting for a subsequent boot or reboot of the system. As a result, accumulation of errors may be avoided, reducing the system crash rate and increasing system service time. Accordingly, runtime cell row replacement in accordance with the present description provides a significant improvement in computer technology.

As set forth above, a known ADDDC repair consumes an available ECC designated memory region to replace a faulty device. It is appreciated that after an ECC available region is used up for memory repair, the computer system may not be tolerant of more errors. If so, known ADDDC repair can impact system reliability.

By comparison, runtime cell row replacement in accordance with the present description need not consume an ECC spare region to replace a faulty row and as a result, a system employing runtime cell row replacement in accordance with the present description can preserve all ECC memory regions for ECC error correction and therefore can be tolerant of more errors. Thus, here too runtime cell row replacement in accordance with the present description improves system reliability.

Moreover, known ADDDC repair typically replaces an entire memory region such as a bank or rank of memory cells at a time. As a result, not only the defective rows but also the non-defective rows of an entire memory region are discarded at the same time. By comparison, a system employing runtime cell row replacement in accordance with the present description can repair a defective memory in runtime at a much smaller granularity than a known ADDDC repair, that is, at a granularity as small as a single row at a time in one embodiment of the present disclosure. It is appreciated that a significant fraction (such as 9% for example) of hard faults in a DRAM are often confined to a single row. Thus, the vast majority of rows of a memory device may be correctly operating rows and a relatively small number of rows may be defective. These properly operating rows of a device having one or more defective rows may be reclaimed during runtime for use by the computer system. In this manner, runtime cell row replacement in accordance with the present description provides yet another improvement in computer technology.

In one aspect of runtime cell row replacement in accordance with the present description, a selected row of memory may be repaired in runtime without operating system (O/S) interaction such that the runtime row repair is transparent to the O/S. In one embodiment, the runtime row repair is performed by logic within the BIOS during a runtime maintenance mode, and interacting with logic in the CPU, a memory controller and a memory module to map a defective memory row of the memory module to a spare or redundant memory row with little or no impact on system performance during runtime. As a result, a computer system such as a server in a cloud environment, for example, may have improved reliability, availability, serviceability and reduced crash rate, providing a significant improvement in computer technology. However, it is appreciated that features and advantages of employing runtime cell row replacement in a computer system in accordance with the present description may vary, depending upon the particular application.

In one embodiment, processor logic responds to a detection of a defective row of memory by interrupting the operating system of the computer system and initiating replacement of the defective row of memory cells with a spare row of memory cells as a replacement row of memory cells. As explained in greater detail below, the replacement of the defective row of memory cells is accomplished during runtime, obviating the need to wait for the next reboot to perform the row replacement. As a result, system reliability, availability and performance may be improved. At an appropriate point in the runtime, the processor logic resumes execution of the operating system and the user applications.

In one aspect of runtime defective cell row replacement in accordance with the present description, the processor logic has multiple operating modes during runtime. One such runtime operating mode is a runtime operating system mode in which the operating system and applications selected by a user execute. A second runtime operating mode is a runtime system maintenance mode in which a single row error handler routine of a Basic Input/Output System (BIOS) executes to initiate replacement of the defective row of memory cells with a replacement row of memory cells.

Although the error handler routine is referred to herein in the illustrated embodiment as a single row error handler routine, it is appreciated that an error handler routine may replace a portion of a row with a replacement row portion, or replace more than one defective row at a time with replacement rows, depending upon the particular application. Similarly, it is appreciated that runtime defective cell row replacement in accordance with the present description may be applied to memory regions having many rows of cells such that detected defective memory regions are replaced with replacement memory regions during runtime system maintenance mode.

In one embodiment, a CPU of the processor logic includes mode control logic which temporarily switches the operating mode of the CPU during runtime from the runtime operating system mode in which the O/S controls the CPU, to the runtime system maintenance mode in which the BIOS controls the CPU. The switch from the runtime operating system mode to the runtime system maintenance mode occurs in response to an interrupt from a memory controller of a memory module. The interrupt is generated in response to detection in the memory module of a single defective row of memory cells of the memory module.

In the illustrated embodiment, the processor logic executes the error handler routine of the Basic Input/Output System (BIOS) in the runtime system maintenance mode in response to the interrupt from the memory controller generated in response to detection in the memory of a defective row of memory cells of the memory. The error handler routine of the BIOS in response to the interrupt from the memory controller, sends a repair request to the memory controller to command the memory to replace the defective row of memory cells of the memory with a replacement row of memory cells selected from spare rows of memory cells of the memory. At an appropriate time, the error handler routine of the BIOS releases control of the CPU to the O/S to minimize impact of the row repair on system performance during runtime.

Components employing runtime cell row replacement in accordance with the present description can be used either in stand-alone processors and memory components, or can be embedded in microprocessors and/or digital signal processors (DSPs). Additionally, it is noted that although systems and processes are described herein primarily with reference to microprocessor based systems in the illustrative examples, it will be appreciated that in view of the disclosure herein, certain aspects, architectures, and principles of the disclosure are equally applicable to other types of device memory and logic devices.

Implementations of the described techniques may include hardware, a method or process, or computer software such a memory component driver on a computer-accessible medium. Thus, embodiments include corresponding computer systems, apparatus, and computer programs recorded on one or more computer storage devices, each configured to perform the actions of the methods.

Operations described herein are performed by logic which is configured to perform the operations either automatically or substantially automatically with little or no system operator intervention, except where indicated as being performed manually such as user selection. Thus, as used herein, the term "automatic" includes both fully automatic, that is operations performed by one or more hardware or software controlled machines with no human intervention such as user inputs to a graphical user selection interface. As used herein, the term "automatic" further includes predominantly automatic, that is, most of the operations (such as greater than 50%, for example) are performed by one or more hardware or software controlled machines with no human intervention such as user inputs to a graphical user selection interface, and the remainder of the operations (less than 50%, for example) are performed manually, that is, the manual operations are performed by one or more hardware or software controlled machines with human intervention such as user inputs to a graphical user selection interface to direct the performance of the operations.

Many of the functional elements described in this specification have been labeled as "logic," in order to more particularly emphasize their implementation independence. For example, a logic element may be implemented as a hardware circuit comprising custom Very Large Scale Integrated (VLSI) circuits or gate arrays, off-the-shelf semiconductors such as logic chips, transistors, or other discrete components. A logic element may also be implemented in firmware or programmable hardware devices such as field programmable gate arrays, programmable array logic, programmable logic devices or the like.

A logic element may also be implemented in software for execution by various types of processors. A logic element which includes executable code may, for instance, comprise one or more physical or logical blocks of computer instructions which may, for instance, be organized as an object, procedure, or function. Nevertheless, the executables of an identified logic element need not be physically located together, but may comprise disparate instructions stored in different locations which, when joined logically together, comprise the logic element and achieve the stated purpose for the logic element.

Indeed, executable code for a logic element may be a single instruction, or many instructions, and may even be distributed over several different code segments, among different programs including device drivers, among different processors, and across several memory devices. Similarly, operational data may be identified and illustrated herein within logic elements, and may be embodied in any suitable form and organized within any suitable type of data structure. The operational data may be collected as a single data set, or may be distributed over different locations including over different storage devices.

Turning to the figures, FIG. 1 is a high-level block diagram illustrating selected aspects of a system implemented according to an embodiment of the present disclosure. System 10 may represent any of a number of electronic and/or computing devices, that may include a memory device. Such electronic and/or computing devices may include computing devices such as a mainframe, server, personal computer, workstation, telephony device, network appliance, virtualization device, storage controller, portable or mobile devices (e.g., laptops, netbooks, tablet computers, personal digital assistant (PDAs), portable media players, portable gaming devices, digital cameras, mobile phones, smartphones, feature phones, etc.) or component (e.g. system on a chip, processor, bridge, memory controller, memory, etc.). In alternative embodiments, system 10 may include more elements, fewer elements, and/or different elements. Moreover, although system 10 may be depicted as comprising separate elements, it will be appreciated that such elements may be integrated on to one platform, such as systems on a chip (SoCs). In the illustrative example, system 10 comprises a central processing unit (CPU) or microprocessor 20, a memory controller 30, a memory 40, a storage drive 44 and peripheral components 50 which may include, for example, video controller, system clock, input device, output device, additional storage, network interface or adapter, battery, etc.

The microprocessor 20 includes a cache 25 that may be part of a memory hierarchy to store instructions and data, and the system memory may include both volatile memory as well as the memory 40 depicted which may include a non-volatile memory. The system memory may also be part of the memory hierarchy. Logic 27 of the microprocessor 20 may include a one or more cores, for example. In some embodiments, the logic 27 may also include a system clock. Communication between the microprocessor 20 and the memory 40 may be facilitated by the memory controller (or chipset) 30, which may also facilitate in communicating with the storage drive 44 and the peripheral components 50. The system may include an offload data transfer engine for direct memory data transfers.

Storage drive 44 includes non-volatile storage and may be implemented as, for example, solid-state drives, magnetic disk drives, optical disk drives, storage area network (SAN), network access server (NAS), a tape drive, flash memory, persistent memory domains and other storage devices employing a volatile buffer memory and a nonvolatile storage memory. The storage may comprise an internal storage device or an attached or network accessible storage. The microprocessor 20 is configured to write data in and read data from the memory 40 and storage 44. Programs in the storage are loaded into the memory 40 and executed by the microprocessor 20. A network controller or adapter enables communication with a network, such as an Ethernet, a Fiber Channel Arbitrated Loop, etc. Further, the architecture may, in certain embodiments, include a video controller configured to render information on a display monitor, where the video controller may be embodied on a video card or integrated on integrated circuit components mounted on a motherboard or other substrate. An input device is used to provide user input to the microprocessor 20, and may include a keyboard, mouse, pen-stylus, microphone, touch sensitive display screen, input pins, sockets, or any other activation or input mechanism known in the art. An output device is capable of rendering information transmitted from the microprocessor 20, or other component, such as a display monitor, printer, storage, output pins, sockets, etc. The network adapter may be embodied on a network card, such as a peripheral component interconnect (PCI) card, PCI-express, or some other input/output (I/O) card, or on integrated circuit components mounted on a motherboard or other substrate.

One or more of the components of the device 10 may be omitted, depending upon the particular application. For example, a network router may lack a video controller, for example. Any one or more of the devices of FIG. 1 including the processor 20, cache 25, logic 27, memory controller 30, memory 40, storage drive 44, peripheral components 50 and system 10, may employ runtime cell row replacement in accordance with the present description.

One example of a nonvolatile storage memory of a nonvolatile storage memory component in accordance with the present description is a 3-dimensional (3D) crosspoint memory, and other types of byte-addressable, write-in-place non-volatile memory. In some embodiments, 3D crosspoint memory may comprise a transistor-less stackable cross point architecture in which memory cells sit at the intersection of word lines and bit lines and are individually addressable and in which bit storage is based on a change in bulk resistance.

In one embodiment, the memory device is a block addressable memory device, such as those based on NAND or NOR technologies. A memory device may also include future generation nonvolatile devices, such as a three dimensional crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product.

Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

Figure 2:
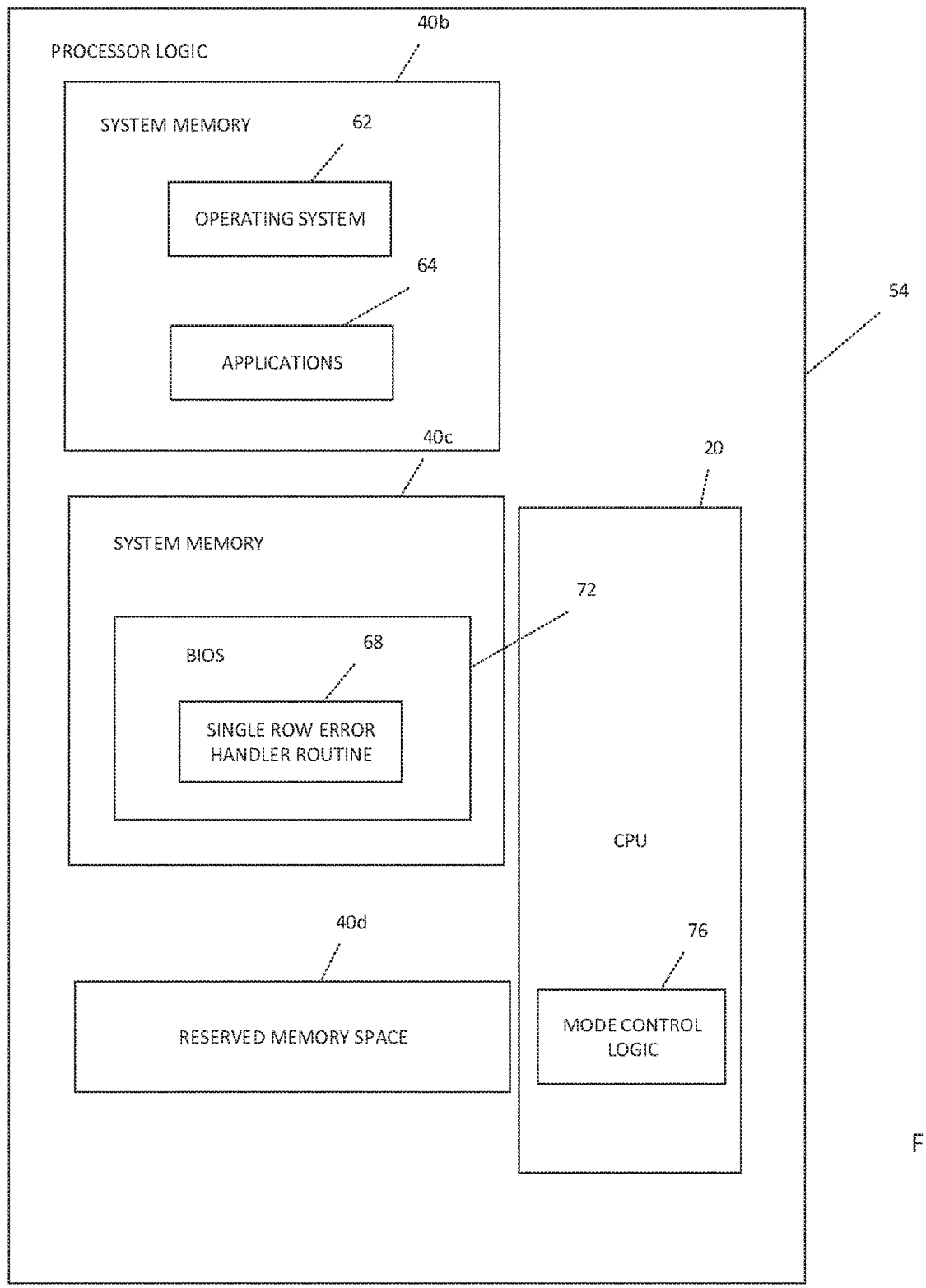
FIG. 2 illustrates an example of a processor logic of a computer system of the computer environment of FIG. 1 employing runtime cell row replacement in accordance with certain embodiments.
Figure 3:
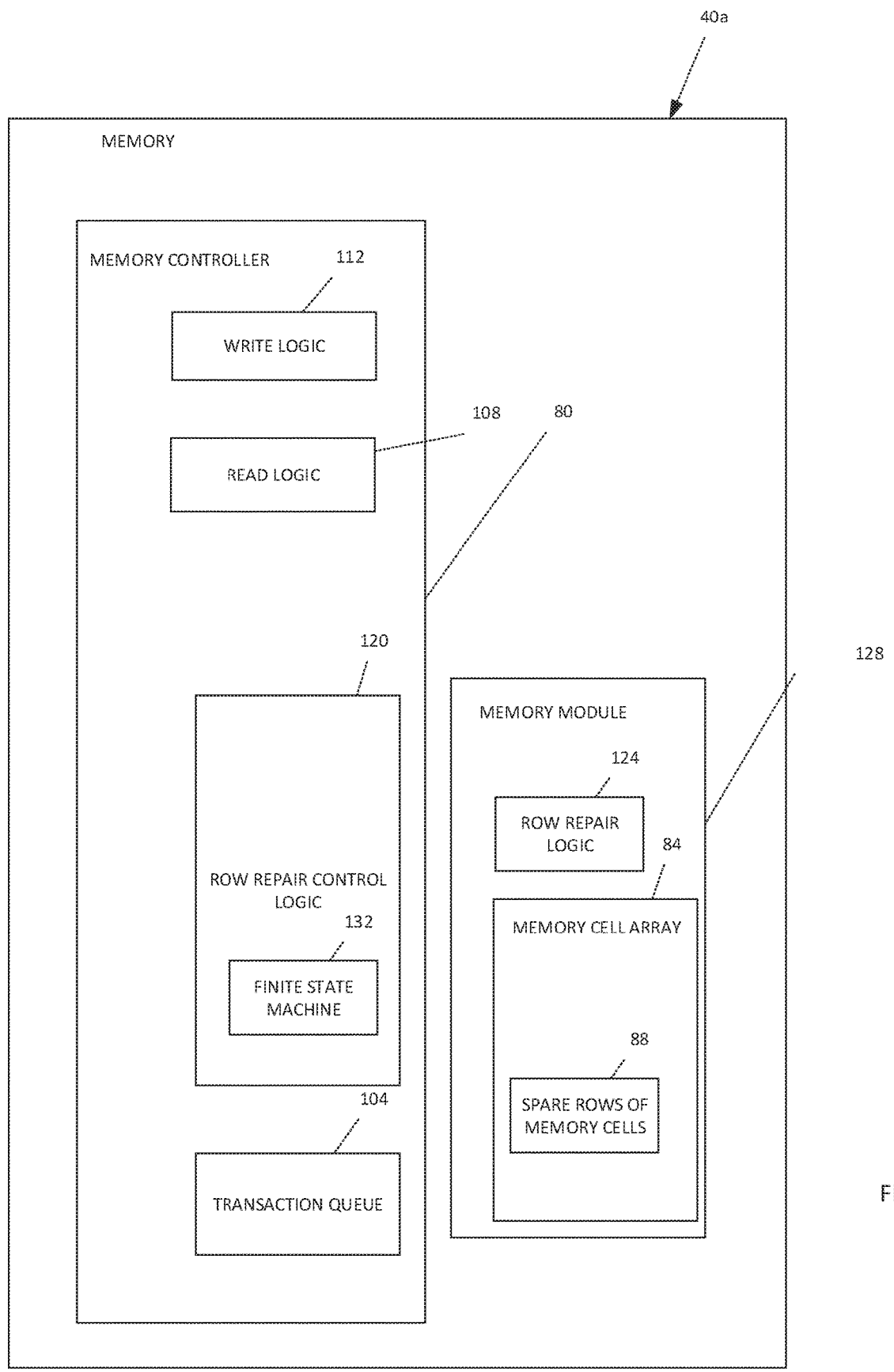
FIG. 3 illustrates an example of a memory of the computing environment of FIG. 1, employing runtime cell row replacement in accordance with the present description.

FIGS. 2 and 3 depict an example of processor logic 54 (FIG. 2) and a memory 40a (FIG. 3), respectively, of the computer system 10 (FIG. 1) employing runtime defective cell row replacement in accordance with one aspect of the present description. In this embodiment, the processor logic 54 (FIG. 2) is configured to execute an operating system 62 and applications 64 during runtime in the computer system after a booting process has been completed in which the operating system 62 is loaded into a system memory 40b and prepared for execution by a CPU or processor 20 (FIGS. 1, 2). One or more of the memory 40a-40d may be located in the memory 40 or the processor cache 25 of FIG. 1, for example. The system memory 40b may be implemented with dynamic random access (DRAM) memory or other suitable memory. For example, the operating system 62 or the applications 64 may reside in suitably fast access storage memory of the memory 40 (FIG. 1) such that loading into another type of fast access memory such as DRAM may be bypassed.

The processor logic 54 is further configured to, in response to detection in the memory 40a (FIG. 2) of a defective row of memory cells having at least one defective cell, interrupt the operating system 62 of the computer system 10 (FIG. 1) and initiate the replacement of the defective row of memory cells with a spare row of memory cells as a replacement row of memory cells. As explained in greater detail below, the replacement of the defective row of memory cells is accomplished during runtime, obviating the need to wait for the next reboot to perform the row replacement. As a result, system reliability and performance may be improved. At an appropriate point in the runtime, the processor logic 54 resumes execution of the operating system 62 and the applications 64.

In one aspect of runtime defective cell row replacement in accordance with the present description, the processor logic 54 is configured to have multiple operating modes during runtime. One such runtime operating mode is an operating system mode in which the operating system 62 and selected applications 64 execute. A second runtime operating mode is a system maintenance mode in which a single row error handler routine 68 of a Basic Input/Output System (BIOS) 72 executes to initiate replacement of the defective row of memory cells with a replacement row of memory cells. In the illustrated embodiment, the error handler routine 68 and the BIOS 72 reside in a read-only memory (ROM) 40c of the memory 40 (FIG. 1). It is appreciated that the error handler routine 68 and the BIOS 72 may be implemented in hardware, firmware, software or a combination of one or more thereof, depending upon the particular application. Also, although the error handler routine 68 is referred to herein in the illustrated embodiment as a single row error handler routine, it is appreciated that an error handler routine in accordance with the present description may replace more than one defective row at a time with replacement rows, depending upon the particular application. Similarly, it is appreciated that runtime defective cell row replacement in accordance with the present description may be applied to memory regions other than rows of cells such that detected defective memory regions are replaced with replacement memory regions during runtime system maintenance mode.

The CPU 20 of the processor logic 54 includes mode control logic 76 which is further configured to switch from the runtime operating system mode to the runtime system maintenance mode in response to an interrupt from a memory controller 80 (FIG. 3) of the memory 40a, which interrupt is generated in response to detection in the memory 40a of a single defective row of memory cells of a memory cell array 84. It is appreciated that other processes or techniques may be utilized to initiate the switch from the runtime operating system mode to the runtime system maintenance mode in response to detection in the memory 40a of a single or multiple defective rows of memory cells.

The processor logic 54 (FIG. 2) is configured to execute the error handler routine 68 of the Basic Input/Output System (BIOS) 72 in the runtime system maintenance mode in response to the interrupt from the memory controller 80 (FIG. 3) generated in response to detection in the memory of a defective row of memory cells of the memory 40a. In one embodiment, the error handler routine 68 of the BIOS 72 is configured to send in response to the interrupt from the memory controller 80 (FIG. 3) generated in response to detection in the memory of a defective row of memory cells, a repair request to the memory controller 80 of the memory 40a to command the memory 40a to replace the defective row of memory cells of the memory cell array 84 with a replacement row of memory cells selected from spare rows of memory cells 88 of the memory cell array 84.

In the illustrated embodiment, the memory controller 80 (FIG. 3) of the memory 40a is configured to maintain during runtime a queue 104 of memory transactions awaiting execution by the memory controller 80. These memory transactions include read operations executed by read logic 108 to read data stored in the memory cell array 84, and write operations executed by write logic 112 to write (store) data into the memory cell array 84.

In one embodiment, the error handler routine 68 (FIG. 2) of the BIOS 72 is configured to send in response to the interrupt from the memory controller 80 generated in response to detection in the memory 40a of a defective row of memory cells, a quiesce command to the memory controller 80 of the memory 40a, commanding the memory controller 80 to clear the queue 104 of memory transactions awaiting execution by the memory controller 80. For example, the quiesce command may be sent by the error handler routine 68 (FIG. 2) prior to sending the repair request to clear any transactions awaiting execution and block additional memory transactions directed to the memory region which includes the defective row of memory cells which will undergo the upcoming repair, to reduce or eliminate conflicts between memory transactions and the repair operation. At an appropriate point in the runtime following initiation of the requested repair operation, the error handler routine 68 (FIG. 2) sends an unquiesce command to the memory controller 80 (FIG. 3) so as to permit the queueing and execution of memory transactions requested by the operating system 62 and the applications 64 to resume in the runtime operating system mode of the processor logic 54.

In one aspect of runtime defective cell row replacement in accordance with the present description, various types of cell row replacement may be employed. For example, one such repair request sent by the error handler routine 68 of the BIOS 72 is a volatile repair request to the memory controller 80 (FIG. 3) of the memory 40a to command the memory 40a to replace the defective row of memory cells with a replacement row of memory cells in a volatile repair which is temporary in nature. An example of a known volatile repair is a soft Post Package Repair (sPPR) which can quickly but temporarily repair a single row of memory cells in a memory such as a DDR4 DRAM device, for example.

In contrast, another repair type request sent by the error handler routine 68 of the BIOS 72 is a volatile repair request to the memory controller 80 (FIG. 3) of the memory 40a to command the memory 40a to replace the defective row of memory cells with a replacement row of memory cells in a nonvolatile repair which is permanent in nature. An example of a known nonvolatile repair is a hard Post Package Repair (hPPR) which can permanently repair a single row of memory cells in a memory such as a DDR4 DRAM device, for example, but typically takes longer to complete. The time for completion of a hard Post Package Repair (hPPR) is frequently measured in seconds whereas the time for completion of a soft Post Package Repair (sPPR) is typically measured in nanoseconds, for example.

In another aspect of runtime defective cell row replacement in accordance with the present description, the error handler routine 68 of the BIOS 72 is configured to release control of the computer system 10 (FIG. 1) back to the operating system 62 at different times or events within the runtime, as a function of the type of repair request sent to the memory controller 80 (FIG. 2). For example, because a soft Post Package Repair may be completed by the memory 40a much more quickly than a hard Post Package Repair, the error handler routine 68 (FIG. 2) of the BIOS 72 can wait until a soft Post Package Repair is completed before releasing control of the computer system 10 back to the operating system 62 without causing undue impact on system performance. Accordingly, in one embodiment, the error handler routine 68 of the BIOS 72 is further configured to send an unquiesce command to the memory controller 80 of the memory 40a and to cause the mode control logic 76 of the processor logic 54 to switch from the runtime system maintenance mode back to the runtime operating system mode in response to another interrupt to the processor logic 54 generated by the memory controller 80 following completion of a volatile repair such as a soft Post Package Repair. In this manner, the queueing and execution of memory transactions requested by the operating system 62 and the applications 64 is permitted to resume in the runtime operating system mode of the processor logic 54, following completion of a volatile repair.

By comparison, because a nonvolatile repair frequently takes much longer to complete as compared to a volatile repair, the error handler routine 68 of the BIOS 72 is further configured to cause the mode control logic 76 of the processor logic 54 to switch from the runtime system maintenance mode back to the runtime operating system mode following sending of the nonvolatile repair request to the memory controller 80 (FIG. 3) without waiting for the nonvolatile repair to complete. Accordingly, the applications 64 running on the operating system 62 can resume execution without waiting for the nonvolatile repair to complete. In this manner, any impact on system performance by the nonvolatile repair operation is reduced.

Once the nonvolatile repair operation is complete, memory transactions from the operating system 62 and the applications 64 may be permitted to resume in the memory region undergoing repair without conflict with the completed nonvolatile repair. Accordingly, as explained in greater detail below, the mode control logic 76 of the processor logic 54 is configured to switch the runtime mode of the CPU 20 of the processor logic 54 from runtime operating system mode back to the runtime system maintenance mode back in response to another interrupt to the processor logic 54 generated by the memory controller 80 following completion of the nonvolatile repair. In the runtime system maintenance mode of the CPU 20, the error handler routine 68 of the BIOS 72 is further configured to send an unquiesce command to the memory controller 80 of the memory 40a and to cause the mode control logic 76 of the CPU 20 to switch from the runtime system maintenance mode back to the runtime operating system mode in response to the interrupt to the processor logic 54 generated by the memory controller 80 following completion of the nonvolatile repair.

In one embodiment, the CPU 20 may include an embedded engine to assist the memory controller 80 in executing the quiesce and unquiesce operations. For example, the embedded engine may utilize firmware which includes Pcode which cooperates with the error handler routine 68 of the BIOS 72 to assist the memory controller 80 in executing the quiesce and unquiesce operations.

In one embodiment, the computer system 10 (FIG. 1) may include a CPU mesh bus interconnecting cores of the CPU 20. A logic interface such as Mesh to Memory (M2M) logic interface provides an interface between the mesh bus and the memory controller 80 (FIG. 3). The error handler routine 68 of the BIOS 72 may send an appropriate command to the Pcode embedded engine of the CPU 20 to block outstanding memory transactions in connection with the quiesce operation. Conversely, the error handler routine 68 of the BIOS 72 may send an appropriate command to the Pcode embedded engine of the CPU 20 to unblock outstanding memory transactions in connection with the unquiesce operation.

In the illustrated embodiment, the memory controller 80 (FIG. 3) of the memory 40a includes row repair control logic 120 configured to be responsive to repair requests from the error handler routine 68 of the BIOS 72 of the processor logic 54 (FIG. 2) to generate defective row repair commands to a row repair logic 124 of a memory module 128 such as a Dual In-line Memory Module (DIMM) which may be external to the memory controller 80 or combined in one module, for example. The memory module 128 includes the memory cell array 84 having in addition to actively used rows of memory, also includes spare rows 88 of memory cells not actively used until selected for row replacement. It is appreciated that the row repair control logic 120 and the row repair logic 124 may be implemented in hardware, firmware, software or a combination of one or more thereof, depending upon the particular application. Although the illustrated embodiment depicts one such memory module 128, it is appreciated that in a memory of a computer system employing runtime defective cell row replacement in accordance with the present description, the number of memory modules controlled by memory controller 80 may vary, depending upon the particular application.

In known DRAM memories, the memory controller is linked to the DIMM module by a link which is trained by training logic within the memory to train the link by sending commands to the DIMM. For example, once the link is trained, the memory controller need only send a read or write command to access data within the DIMM. In known DRAM memories, the training logic is typically not active once the link has been trained.

In the illustrated embodiment of runtime defective cell row replacement of the present description, the memory controller 80 (FIG. 3) sends volatile and nonvolatile repair commands such as sPPR and hPPR to the DIMM during runtime system maintenance mode of operation. Accordingly, in one embodiment, the row repair control logic 120 includes a finite state machine 132 to control aspects of the row repair logic 124 of the memory module 128, including sending appropriate volatile and nonvolatile repair commands to the DIMM 128.

In one aspect of runtime defective cell row replacement of the present description, the runtime row repair is initiated during runtime system maintenance mode which is used in one embodiment, only by the BIOS 72 and not by the O/S 62 nor the applications 64. Thus, in one embodiment neither the O/S 62 nor the applications 64 can access the row repair control logic 120 and its finite state machine 132 to enhance security by preventing malicious software from accessing the row repair control logic 120 and its finite state machine 132.

In one embodiment, the memory cell array 84 may be logically configured in banks of memory cells, each bank of memory cells being logically configured in rows and columns of memory cells. The banks of memory cells may be logically grouped in bank groups (BG). It is appreciated that other logical configurations of memory cells may be utilized depending upon the particular application.

The row repair logic of known memory modules limit the number of soft or volatile repairs such as soft Post Production Repairs during boot and reboot to one such single row repair per bank group of the memory module and may permit hard or nonvolatile repairs to be performed before the volatile repair is performed. A volatile repair command to the row repair logic of the memory module typically takes the form of a write command and remains in effect as long as the voltage or power applied to the memory module remains with a specified operating range. Completion of the single row volatile repair is typically on the order of a few nanoseconds. Once the voltage or power to the memory module drops below the specified operating range due to a system reset or shut down, for example, the volatile repair is erased.

The memory module 128 of the illustrated embodiment may be similar to that of known memory modules employing known boot time row repair, but it is appreciated that the memory module 128 of the illustrated embodiment is modified as appropriate to employ runtime defective cell row replacement as described herein. Moreover, it is further appreciated that for the memory module 128 of the illustrated embodiment, the permitted number of volatile repair operations, the permitted number of row repairs, the format of the volatile repair commands and the conditions under which a volatile repair persists may vary, depending upon the particular application.

The row repair logic of known memory modules typically allows the number of nonvolatile repairs such as hard Post Production Repairs during booting or rebooting to be one or more such single row nonvolatile repairs per bank group of the memory module and may require any outstanding single row soft or volatile repairs to be performed before the nonvolatile repair is performed. A nonvolatile repair command to the row repair logic of the memory module typically takes the form of a write command such as known WR or WRA commands and remains permanently in effect whether or not the voltage or power applied to the memory module remains within a specified operating range. Completion of the nonvolatile repair is typically on the order of one or more seconds. Should the voltage or power to the memory module drop below the specified operating range due to a system reset or shut down, for example, the nonvolatile repair nonetheless remains in effect. However, it is appreciated that for the memory module 128 of the illustrated embodiment, the permitted number of nonvolatile repair operations, the permitted number of rows to be repaired in a nonvolatile repair operation, the format of the nonvolatile repair command and the conditions under which the nonvolatile repair persists may vary, depending upon the particular application.

Figure 4:
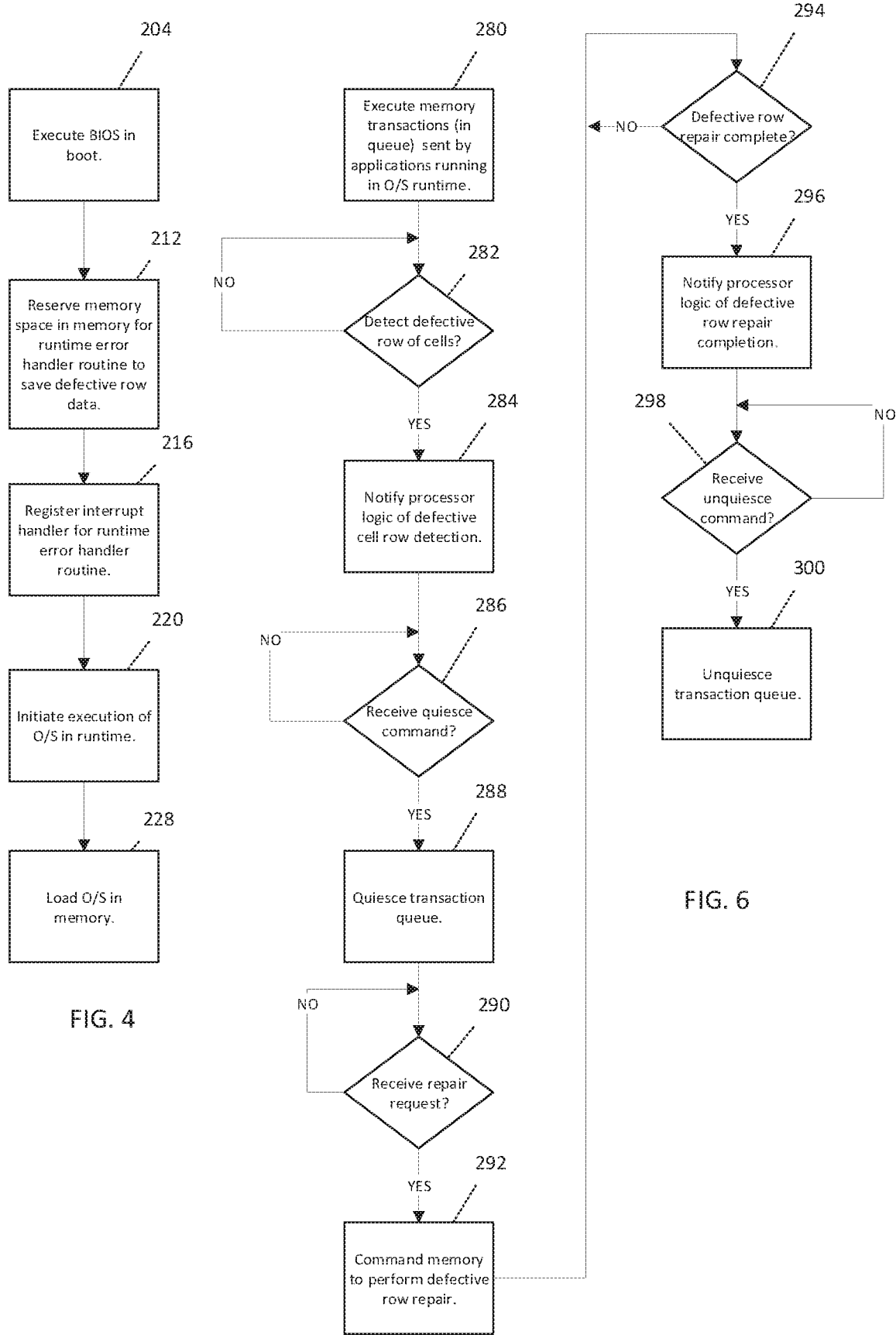
FIG. 4 depicts an example of boot operations of the processor logic of FIG. 2.

FIG. 4 depicts one embodiment of operations of the processor logic 54 (FIG. 2) booting up in preparation for runtime defective cell row replacement in accordance with the present description. In this embodiment, the BIOS 72 implemented in firmware and/or routines stored in the read-only-memory 40c controls the CPU 20 which executes (block 204, FIG. 4) routines of the BIOS 72 to boot the computer system 10 (FIG. 1) in a boot time preceding the runtime in which the operating system 62 and the applications 64 control the CPU 20.

Functions of the BIOS 72 may include for example, power-on self tests (POST) and enabling access by the CPU 20 to the system memory and storage. The error handler routine 68 of the BIOS 72 also reserves (block 212) memory space 40d (FIG. 2) in preparation for the error handler routine 68 of the BIOS 72 preserving the row data of a detected defective row of memory cells in the runtime system maintenance mode.

In one embodiment, the memory space 40d may be reserved in system RAM which is invisible to the O/S 62. Hence, the O/S 62 does not have access to the reserved memory space 40d during runtime operating system mode to avoid errors such as conflicts in this memory region. In the illustrated embodiment, this reserved space 40d has a capacity such as at least 8 kilobytes (KB) to save a single row of row data. It is appreciated that the type of reserved memory space and its capacity may vary, depending upon the particular application.

The error handler routine 68 of the BIOS 72 also registers (block 216, FIG. 4) a system maintenance mode interrupt handler routine of the error handler routine 68 of the BIOS 72 in preparation for the error handler routine 68 of the BIOS 72 causing the repair of a detected defective row of memory cells in the runtime system maintenance mode. Upon completion of the boot process, the BIOS 72 releases control of the CPU 20, causing the mode control logic 76 of the CPU 20 to switch from the boot mode of operation to the runtime operating system mode to initiate execution (block 220, FIG. 4) of the operating system 62 in runtime. The CPU 20 loads (block 228, FIG. 4) the operating system 62 in a memory such as the system memory 40*b* (FIG. 2) in preparation for the operating system mode of the CPU 20 in runtime.

Figure 5:
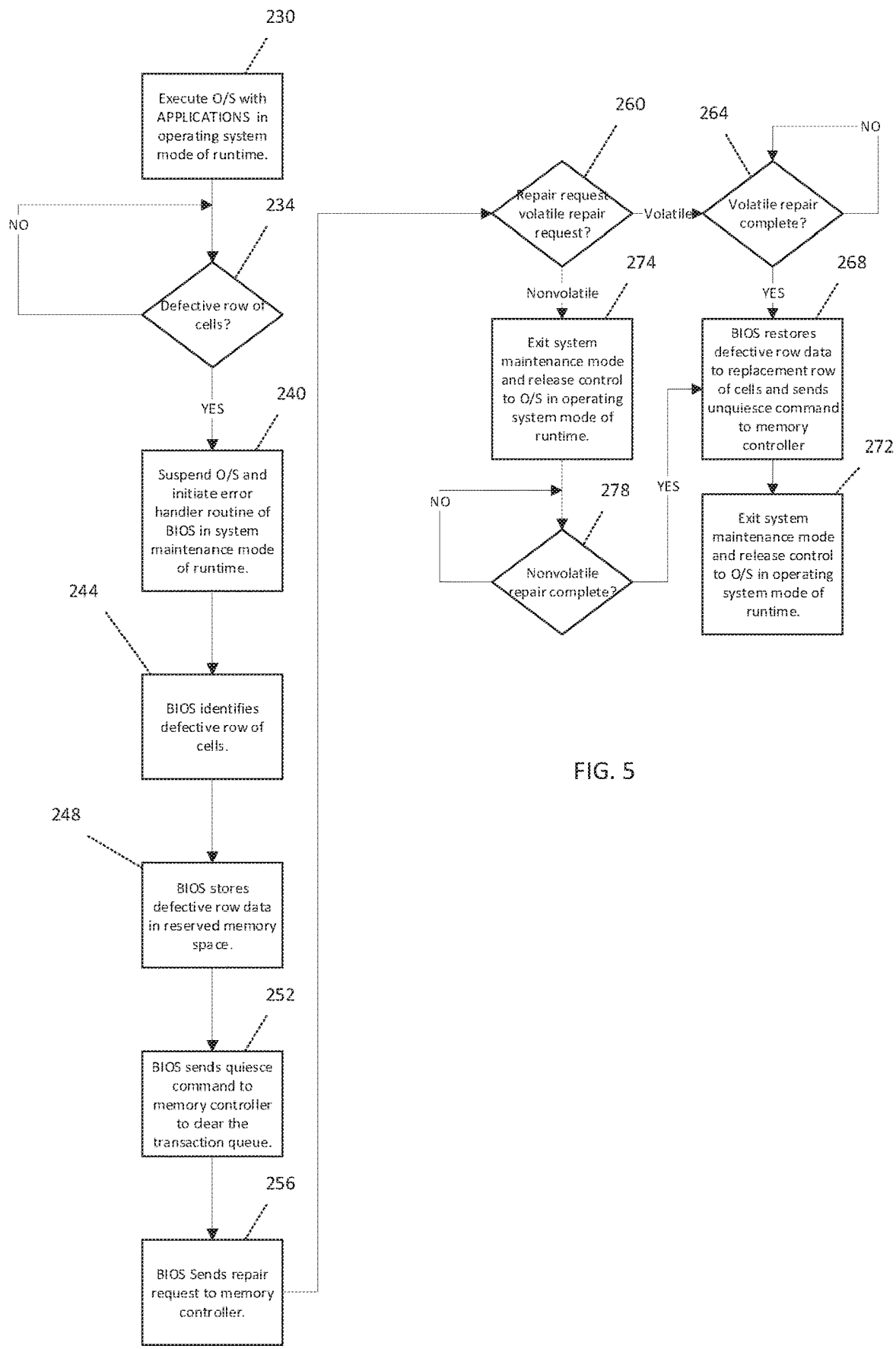
FIG. 5 depicts an example of runtime operations of the processor logic of FIG. 2.

FIG. 5 depicts an example of operations of the processor logic 54 in runtime following the completion of booting the computer system 10 (FIG. 1) as described in connection with FIG. 4 above. The operating system 62 executes (block 230, FIG. 5) in the runtime operating system mode of runtime. The operating system 62 of this embodiment includes a kernel such as Linux or Microsoft's Windows which typically provides a graphical user interface which permits a user of the computer system 10 to log in to the computer system and run one or more of the applications 64 (FIG. 2) over the O/S 62.

In the event that a defective row of memory cells is detected (block 234, FIG. 5), the processor logic 54 suspends (block 240, FIG. 5) the O/S 62 and initiates the error handler routine 68 of the BIOS 72. As described above, in the illustrated embodiment, defective memory cell rows are detected by the memory 40*a* and in response to such a defective row detection, the memory controller 80 (FIG. 3) sets an interrupt such as a system maintenance mode interrupt (SMI), for example. In response to the SMI interrupt from the memory controller 80, the mode control logic 76 of the CPU 20 switches the operating mode of the CPU 20 from the runtime operating system mode to the runtime system maintenance mode of runtime. In connection with the switch from the runtime operating system mode to the runtime system maintenance mode, the interrupt handler previously registered (block 216, FIG. 4) during the boot up process, causes the error handler routine 68 of the BIOS 72 to execute in the runtime system maintenance mode of runtime.

The error handler routine 68 of the BIOS 72 executing in the runtime system maintenance mode identifies (block 244, FIG. 5) the detected defective row of memory cells. In one embodiment, the memory 40*a* stores the row address of the detected defective row of memory cells in a register accessible to the error handler routine 68 of the processor logic 54. Having identified the defective row of memory cells, the error handler routine 68 of the BIOS 72 reads the row data from the detected defective row of memory cells and stores (block 248, FIG. 5) the defective row data in the reserved system memory space 40*d* (FIG. 2). In the illustrated embodiment, the error handler routine 68 of the BIOS 72 BIOS reads up to 128 cache lines corresponding to 128 columns of the detected defective single row of memory cells and stores them in the reserved memory space 40*d*. It is appreciated that the quantity and format of row data transferred from detected defective rows of memory cells may vary, depending upon the particular application.

The error handler routine 68 of the BIOS 72 then sends (block 252, FIG. 5) a quiesce command to the memory controller 80 (FIG. 3) to clear the transaction queue 104 and block additional memory transactions directed to the memory region which includes the defective row of memory cells which will undergo the upcoming repair. As described above, in one embodiment, the error handler routine 68 of the BIOS 72 may send an appropriate command to the Pcode embedded engine of the CPU 20 to block outstanding memory transactions in connection with the quiesce operation.

Having cleared the transaction queue 104 and blocked memory transactions, the error handler routine 68 of the BIOS 72 sends (block 256, FIG. 5) a repair request to the memory controller 80. If the repair request is a request for a volatile repair (block 260, FIG. 5) of the defective row of memory cells, the error handler routine 68 of the BIOS 72 awaits (block 264, FIG. 5) completion of the requested volatile repair. As described above, in one embodiment, the memory controller 80 generates an interrupt to notify the processor logic 54 that the repair request has been completed.

Once the error handler routine 68 of the BIOS 72 determines (block 264, FIG. 5) that the requested volatile repair has been completed, the error handler routine 68 of the BIOS 72 restores (block 268) the defective row data to the replacement row selected by the completed volatile repair by transferring the defective row data preserved (block 248, FIG. 5) and in the reserved memory space 40*d* to the selected replacement row. In addition, the error handler routine 68 of the BIOS 72 sends (block 268, FIG. 5) an unquiesce command to the memory controller 80. The error handler routine 68 of the BIOS 72 may also send an appropriate command to the Pcode embedded engine of the CPU 20 to unblock memory transactions in connection with the unquiesce operation. In this manner, the memory controller is set up to resume processing memory transactions from the O/S 62 and the applications 64 once the runtime operating system mode is restored. Accordingly, the error handler routine 68 of the BIOS 72 causes the CPU 20 to exit (block 272, FIG. 5) the runtime system maintenance mode, releasing control to the O/S 62.

It is appreciated that volatile repairs may be completed relatively quickly such that any disruption to operations of the O/S 62 and the applications 64 is relatively short in duration. By comparison, nonvolatile repairs may take significantly longer to complete in various embodiments. Accordingly, if the repair request sent (block 252, FIG. 5) is a request for a nonvolatile repair (block 260, FIG. 5) of the defective row of memory cells, the error handler routine 68 of the BIOS 72 in this embodiment does not wait for completion of the requested nonvolatile repair. Instead, following sending (block 252, FIG. 5) the nonvolatile repair request, the error handler routine 68 of the BIOS 72 causes the CPU 20 to exit (block 274, FIG. 5) the runtime system maintenance mode, releasing control to the O/S 62. In this manner, any disruption to the operations of the O/S 62 and the applications 64 which are not directed to the memory region which includes the defective row of memory cells undergoing repair, is relatively short in duration. However, due to quiescing (block 252, FIG. 5) the transaction queue of the memory region which includes the defective row undergoing nonvolatile repair, memory transactions directed to that memory region remain blocked while the nonvolatile repair proceeds.

In some embodiments, the memory controller 80 may control multiple memory regions and may have a transaction queue 104 for each such memory region. Accordingly, a quiesce command from the error handler routine 68 of the BIOS 72 may be limited to the particular memory region which includes the defective row undergoing nonvolatile repair. Thus, once control is restored to the O/S 62 and the applications 64 in the runtime operating system mode, memory transactions not directed to the particular memory region which includes the defective row undergoing nonvolatile repair may proceed notwithstanding that the nonvolatile repair has not been completed.

Once the error handler routine 68 of the BIOS 72 determines (block 278, FIG. 5) that the requested nonvolatile repair has been completed, the error handler routine 68 of the BIOS 72 restores (block 268) in a manner similar that described above in connection with a volatile repair, the defective row data to the replacement row selected by the completed nonvolatile repair by transferring the preserved defective row data (block 248, FIG. 5) from the reserved memory space 40*d* to the selected replacement row. In addition, the error handler routine 68 of the BIOS 72 sends (block 268, FIG. 5) an unquiesce command to the memory controller 80 so as to permit the memory controller to resume processing memory transactions from the O/S 62 and the applications 64 once the runtime operating system mode is restored. Here too, error handler routine 68 of the BIOS 72 may send an appropriate command to the Pcode embedded engine of the CPU 20 to unblock outstanding memory transactions in connection with the unquiesce operation.

The error handler routine 68 of the BIOS 72 causes the CPU 20 to exit (block 272, FIG. 5) the runtime system maintenance mode, releasing control to the O/S 62. As described above, in one embodiment, the memory controller 80 generates an interrupt to notify the processor logic 54 that the repair request has been completed.

FIG. 6 depicts one example of operations of the memory 40*a* (FIG. 3) employing runtime defective cell row replacement in accordance with the present description. In this example, operations of the memory 40*a* are occurring in the runtime operating system mode of the CPU 20 (FIG. 2) such that memory transactions sent by the O/S 62 and applications 64 are being executed (block 280, FIG. 6). As these memory transactions are being executed, the memory 40*a* may detect (block 282, FIG. 6) a row of memory cells having one or more defective memory cells. In one embodiment, the presence of a defective cell row in the memory cell array 84 (FIG. 3) is detected by the memory module 128 although it is appreciated that such detection logic may be implemented in other devices of the memory 40*a* or the computer system 10 (FIG. 1), depending upon the particular application.

In response to the detection of a defective row of cells, the row repair control logic 120 of the memory controller 80 notifies (block 284, FIG. 6) the processor logic 54 (FIG. 3) of the defective cell row detection. In the illustrated embodiment, the memory 40*a* stores the row address of the detected defective cell row in a register accessible to the processor logic 54 (FIG. 2) and generates an interrupt such as an SMI interrupt, for example, to the processor logic 54.

As described above in connection with FIG. 5, the CPU 20 switches from the runtime operating system mode to the runtime system maintenance mode in response to the defective cell row notification from the memory 40*a* and executes the error handler routine 68 of the BIOS 72 which preserves the row data of the defective cell row in the reserved memory space 40*d*, issues a quiesce command to the memory 40*a* to block memory transactions and issues a volatile or nonvolatile repair request to the memory 40*a*, as appropriate.

Upon receipt (block 286, FIG. 6) of the quiesce command from the processor logic 54, the memory 40*a* clears (block 288, FIG. 6) the transaction queue 104 and blocks memory transactions with, in one embodiment, assistance from an embedded engine in the CPU 20 as described above. Upon receipt (block 290, FIG. 6) of a repair request from the processor logic 54 (FIG. 2), the memory 40*a* commands (block 292, FIG. 6) the memory module 128 to perform the requested row repair, be it a volatile or nonvolatile repair request.

One known row repair includes writing a faulty row address to a faulty row address memory of the module. A comparator compares an incoming address of a memory transaction to be executed to the addresses in the faulty row address memory. If an incoming address matches a faulty address stored in the faulty address memory, the incoming address is remapped by the memory module to the address of the replacement row. The remapping is temporary for volatile repairs and permanent for nonvolatile repairs. The memory module 128 of the illustrated embodiment may perform a row repair in a similar manner in response to a repair command from the memory controller 80 except that the repair is performed in the runtime system maintenance mode rather than during a boot or reboot.

Upon completion (block 294, FIG. 6) of the defective row repair, the memory 40*a* notifies (block 296, FIG. 6) the processor logic 54 that the requested row repair has been completed. In one embodiment, the row repair control logic 120 of the memory 40*a* notifies the processor logic 54 of the completion of the requested row repair by generating a suitable interrupt, such as an SMI interrupt, for example.

As described above in connection with FIG. 5, the CPU 20 switches back to the runtime system maintenance mode if it was in the runtime operating system mode when the row repair completion notification was received. Alternatively, the CPU 20 remains in the runtime system maintenance mode if it was in the runtime system maintenance mode when the row repair completion notification was received. In the runtime system maintenance mode, the error handler routine 68 of the BIOS 72, in response to the row repair completion notification from the memory 40*a*, sends an unquiesce command to the memory 40*a*. Upon receipt (block 298, FIG. 6) of the unquiesce command, the memory controller 80 restores (block 300, FIG. 6) operation of the transaction queue and Mesh to Memory logic as described above, unblocks execution of memory transactions. In addition, the error handler routine 68 of the BIOS 72 restores the row data preserved in the reserved memory space 40*d*, to the replacement cell row selected by the repair operation. The error handler routine is completed by the error handler routine 68 causing the CPU 20 to switch back to the runtime operating system mode wherein the error handler routine 68 of the BIOS 72 releases control of the CPU 20 back to the O/S 62 and the applications 64.

The described operations may be implemented as a method, apparatus or computer program product using standard programming and/or engineering techniques to produce software, firmware, hardware, or any combination thereof. The described operations may be implemented as code maintained in a "computer readable storage medium", where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and nonvolatile memory devices (e.g., EEPROMs, ROMs, PROMs, RAMs, DRAMs, SRAMs, Flash Memory, firmware, programmable logic, etc.), Solid State Drives (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmission signals. Those skilled in the art will recognize that many modifications may be made to this configuration, and that the article of manufacture may comprise suitable information bearing medium known in the art.

Computer program code for carrying out operations for aspects of the certain embodiments may be written in any combination of one or more programming languages. Blocks of the flowchart and block diagrams may be implemented by computer program instructions.

Certain embodiments may be directed to a method for deploying computing instruction by a person or automated processing integrating computer-readable code into a computing system, wherein the code in combination with the computing system is enabled to perform the operations of the described embodiments.

The terms "an embodiment", "embodiment", "embodiments", "the embodiment", "the embodiments", "one or more embodiments", "some embodiments", and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments need not include the device itself.

At least certain operations that may have been illustrated in the figures show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to be limited to the precise forms disclosed. Many modifications and variations are possible in light of the above teaching.

EXAMPLES

The following examples pertain to further embodiments.

Example 1 is an apparatus for use with a computer system having a memory including a memory controller and a plurality of rows of cells including at least one spare row of cells, comprising: processor logic configured to: execute an operating system in the computer system, in response to detection in the memory of a defective row of memory cells having at least one defective cell, interrupt the operating system of the computer system and initiate the replacement of a detected defective row of memory cells with a spare row of memory cells as a replacement row of memory cells, and resume execution of the operating system.

In Example 2, the subject matter of Examples 1-9 (excluding the present Example) can optionally include wherein the processor logic is further configured to have a first runtime operating system mode in which the operating system executes, and a second runtime system maintenance mode in which an error handler routine executes to initiate replacement of the defective row of memory cells with a replacement row of memory cells, and to switch from the first runtime operating system mode to the second runtime system maintenance mode in response to a first interrupt from the memory controller generated in response to detection in the memory of a defective row of memory cells.

In Example 3, the subject matter of Examples 1-9 (excluding the present Example) can optionally include wherein the processor logic is further configured to execute a Basic Input/Output System (BIOS) in the second runtime system maintenance mode and wherein the BIOS includes the error handler routine configured to be executed in response to a first interrupt from the memory controller generated in response to detection in the memory of a defective row of memory cells.

In Example 4 the subject matter of Examples 1-9 (excluding the present Example) can optionally include wherein the error handler routine of the BIOS is configured to send in response to the first interrupt from the memory controller generated in response to detection in the memory of a defective row of memory cells, a repair request to the memory controller of the memory to command the memory to replace the defective row of memory cells with a replacement row of memory cells.

In Example 5, the subject matter of Examples 1-9 (excluding the present Example) can optionally include wherein the memory controller is configured to maintain a queue of memory transactions awaiting execution by the memory controller and wherein the error handler routine of the BIOS is configured to send in response to the first interrupt from the memory controller generated in response to detection in the memory of a defective row of memory cells, a quiesce command to the memory controller of the memory commanding the memory controller to clear the queue of memory transactions awaiting execution by the memory controller and to block memory transactions awaiting execution by the memory controller.

In Example 6, the subject matter of Examples 1-9 (excluding the present Example) can optionally include wherein the BIOS is configured to reserve a memory space in the computer system during booting of the computer system and wherein the error handler routine of the BIOS is further configured to preserve defective row data of the defective row of memory cells in the reserved memory space and restore defective row data from the reserved memory space to a replacement row of memory cells selected to replace the defective row of memory cells.

In Example 7, the subject matter of Examples 1-9 (excluding the present Example) can optionally include wherein the repair request sent by the BIOS is a volatile repair request to the memory controller of the memory to command the memory to replace the defective row of memory cells with a replacement row of memory cells in a volatile repair, and wherein the error handler routine of the BIOS is further configured to send an unquiesce command to the memory controller of the memory and to cause the processor logic to switch from the second runtime system maintenance mode back to the first runtime operating system mode in response to a second interrupt to the processor logic generated by the memory controller following completion of the volatile repair.

In Example 86, the subject matter of Examples 1-9 (excluding the present Example) can optionally include wherein the repair request sent by the BIOS is a nonvolatile repair request to the memory controller of the memory to command the memory to replace the defective row of memory cells with a replacement row of memory cells in a nonvolatile repair, and wherein the error handler routine of the BIOS is further configured to cause the processor logic to switch from the second runtime system maintenance mode back to the first runtime operating system mode following sending of the nonvolatile repair request, wherein the processor logic is further configured to switch from the first runtime operating system mode back to the second runtime system maintenance mode back in response to a second interrupt to the processor logic generated by the memory controller following completion of the nonvolatile repair, and wherein the error handler routine of the BIOS is further configured to send an unquiesce command to the memory controller of the memory and to cause the processor logic to switch from the second runtime system maintenance mode back to the first runtime operating system mode in response to the second interrupt to the processor logic generated by the memory controller following completion of the nonvolatile repair.

In Example 9, the subject matter of Examples 1-9 (excluding the present Example) can optionally include a system, said system comprising: said processor logic and said memory, and at least one of a display communicatively coupled to the processor logic, a network interface communicatively coupled to the processor logic, and a battery coupled to provide power to the system.

Example 10 is a method, comprising: executing an operating system in a computer system, detecting in a memory of the computer system, a defective row of memory cells having at least one defective cell, in response to the detecting, interrupting the operating system of the computer system and replacing the defective row of memory cells with a spare row of memory cells as a replacement row of memory cells, and resuming execution of the operating system.

In Example 11, the subject matter of Examples 10-17 (excluding the present Example) can optionally include wherein the computer system includes a processor having a first runtime operating system mode in which the operating system executes, and a second runtime system maintenance mode in which an error handler routine executes to replace the defective row of memory cells with a replacement row of memory cells, and wherein the interrupting the operating system of the computer system includes a memory controller of the memory generating a first interrupt to the processor, and the replacing the defective row of memory cells with a replacement row of memory cells includes the processor switching from the first runtime operating system mode to the second runtime system maintenance mode in response to the first interrupt from the memory controller.

In Example 12, the subject matter of Examples 10-17 (excluding the present Example) can optionally include wherein a Basic Input/Output System (BIOS) executes in the second runtime system maintenance mode and wherein the BIOS includes the error handler routine.

In Example 13, the subject matter of Examples 10-17 (excluding the present Example) can optionally include wherein the replacing the defective row of memory cells with a replacement row of memory cells includes the error handler routine of the BIOS sending a repair request to the memory controller of the memory to command the memory to replace the defective row of memory cells with a replacement row of memory cells.

In Example 14, the subject matter of Examples 10-17 (excluding the present Example) can optionally include wherein the replacing the defective row of memory cells with a replacement row of memory cells includes the error handler routine of the BIOS sending a quiesce command to the memory controller of the memory commanding the memory controller to clear a queue of memory transactions awaiting execution by the memory controller.

In Example 15, the subject matter of Examples 10-17 (excluding the present Example) can optionally include the error handler routine of the BIOS preserving defective row data of the defective row of memory cells in a reserved memory space and restoring defective row data from the reserved memory space and to the replacement row of memory cells following completion of the replacement of the defective row of memory cells.

In Example 16, the subject matter of Examples 10-17 (excluding the present Example) can optionally include wherein the repair request sent by the BIOS is a volatile repair request to the memory controller of the memory to command the memory to replace the defective row of memory cells with a replacement row of memory cells in a volatile repair, and wherein the method further comprises following completion of the volatile repair, the memory controller of the memory generating a second interrupt to the processor, and in response to the second interrupt, the error handler routine of the BIOS sending an unquiesce command to the memory controller of the memory and the processor switching from the second runtime system maintenance mode back to the first runtime operating system mode.

In Example 17, the subject matter of Examples 10-17 (excluding the present Example) can optionally include wherein the repair request sent by the BIOS is a nonvolatile repair request to the memory controller of the memory to command the memory to replace the defective row of memory cells with a replacement row of memory cells in a nonvolatile repair, and wherein the method further comprises following sending of the nonvolatile repair request, the error handler routine of the BIOS causing the processor to switch from the second runtime system maintenance mode back to the first runtime operating system mode, and, the memory controller of the memory generating a second interrupt to the processor upon completion of the nonvolatile repair, and in response to the second interrupt, the processor switching back to the second runtime system maintenance mode in which the error handler routine of the BIOS sends an unquiesce command to the memory controller of the memory and causes the processor to switch from the second runtime system maintenance mode back to the first runtime operating system mode.

Example 18 is an apparatus comprising means to perform a method as claimed in any preceding example.

Example 19 is a computer system, comprising: a memory having a memory controller and a plurality of rows of cells including at least one spare row of cells, and processor logic configured to: execute an operating system in the computer system, in response to detection in the memory of a defective row of memory cells having at least one defective cell, interrupt the operating system of the computer system and initiate the replacement of a detected defective row of memory cells with a spare row of memory cells as a replacement row of memory cells, and resume execution of the operating system.

In Example 20, the subject matter of Examples 19-27 (excluding the present Example) can optionally include wherein the processor logic is further configured to have a first runtime operating system mode in which the operating system executes, and a second runtime system maintenance mode in which an error handler routine executes to initiate replacement of the defective row of memory cells with a replacement row of memory cells, and to switch from the first runtime operating system mode to the second runtime system maintenance mode in response to a first interrupt from the memory controller generated in response to detection in the memory of a defective row of memory cells.

In Example 21, the subject matter of Examples 19-27 (excluding the present Example) can optionally include wherein the processor logic is further configured to execute a Basic Input/Output System (BIOS) in the second runtime system maintenance mode and wherein the BIOS includes the error handler routine configured to be executed in response to a first interrupt from the memory controller generated in response to detection in the memory of a defective row of memory cells.

In Example 22, the subject matter of Examples 19-27 (excluding the present Example) can optionally include wherein the error handler routine of the BIOS is configured to send in response to the first interrupt from the memory controller generated in response to detection in the memory of a defective row of memory cells, a repair request to the memory controller of the memory to command the memory to replace the defective row of memory cells with a replacement row of memory cells.

In Example 23, the subject matter of Examples 19-27 (excluding the present Example) can optionally include wherein the memory controller is configured to maintain a queue of memory transactions awaiting execution by the memory controller and wherein the error handler routine of the BIOS is configured to send in response to the first interrupt from the memory controller generated in response to detection in the memory of a defective row of memory cells, a quiesce command to the memory controller of the memory commanding the memory controller to clear the queue of memory transactions awaiting execution by the memory controller and to block memory transactions awaiting execution by the memory controller.

In Example 24, the subject matter of Examples 19-27 (excluding the present Example) can optionally include wherein the BIOS is configured to reserve a memory space in the computer system during booting of the computer system and wherein the error handler routine of the BIOS is further configured to preserve defective row data of the defective row of memory cells in the reserved memory space and restore defective row data from the reserved memory space to a replacement row of memory cells selected to replace the defective row of memory cells.

In Example 25, the subject matter of Examples 19-27 (excluding the present Example) can optionally include wherein the repair request sent by the BIOS is a volatile repair request to the memory controller of the memory to command the memory to replace the defective row of memory cells with a replacement row of memory cells in a volatile repair, and wherein the error handler routine of the BIOS is further configured to send an unquiesce command to the memory controller of the memory and to cause the processor logic to switch from the second runtime system maintenance mode back to the first runtime operating system mode in response to a second interrupt to the processor logic generated by the memory controller following completion of the volatile repair.

In Example 26, the subject matter of Examples 19-27 (excluding the present Example) can optionally include wherein the repair request sent by the BIOS is a nonvolatile repair request to the memory controller of the memory to command the memory to replace the defective row of memory cells with a replacement row of memory cells in a nonvolatile repair, and wherein the error handler routine of the BIOS is further configured to cause the processor logic to switch from the second runtime system maintenance mode back to the first runtime operating system mode following sending of the nonvolatile repair request, wherein the processor logic is further configured to switch from the first runtime operating system mode back to the second runtime system maintenance mode back in response to a second interrupt to the processor logic generated by the memory controller following completion of the nonvolatile repair, and wherein the error handler routine of the BIOS is further configured to send an unquiesce command to the memory controller of the memory and to cause the processor logic to switch from the second runtime system maintenance mode back to the first runtime operating system mode in response to the second interrupt to the processor logic generated by the memory controller following completion of the nonvolatile repair.

In Example 27, the subject matter of Examples 19-27 (excluding the present Example) can optionally include at least one of: a display communicatively coupled to the central processing unit, a network interface communicatively coupled to the central processing unit, and a battery coupled to provide power to the system.

Example 28 is an apparatus for use with a computer system having a memory including a memory controller and a plurality of rows of cells including at least one spare row of cells, comprising: processor logic means configured for: executing an operating system in the computer system, in response to detection in the memory of a defective row of memory cells having at least one defective cell, interrupting the operating system of the computer system and initiate the replacement of a detected defective row of memory cells with a spare row of memory cells as a replacement row of memory cells, and resuming execution of the operating system.

In Example 29, the subject matter of Examples 28-36 (excluding the present Example) can optionally include wherein the processor logic means is further configured to have a first runtime operating system mode in which the operating system executes, and a second runtime system maintenance mode in which an error handler routine executes to initiate replacement of the defective row of memory cells with a replacement row of memory cells, and to switch from the first runtime operating system mode to the second runtime system maintenance mode in response to a first interrupt from the memory controller generated in response to detection in the memory of a defective row of memory cells.

In Example 30, the subject matter of Examples 28-36 (excluding the present Example) can optionally include wherein the processor logic means is further configured to execute a Basic Input/Output System (BIOS) in the second runtime system maintenance mode and wherein the BIOS includes the error handler routine configured to be executed in response to a first interrupt from the memory controller generated in response to detection in the memory of a defective row of memory cells.

In Example 31, the subject matter of Examples 28-36 (excluding the present Example) can optionally include wherein the error handler routine of the BIOS is configured to send in response to the first interrupt from the memory controller generated in response to detection in the memory of a defective row of memory cells, a repair request to the memory controller of the memory to command the memory to replace the defective row of memory cells with a replacement row of memory cells.

In Example 32, the subject matter of Examples 28-36 (excluding the present Example) can optionally include wherein the memory controller is configured to maintain a queue of memory transactions awaiting execution by the memory controller and wherein the error handler routine of the BIOS is configured to send in response to the first interrupt from the memory controller generated in response to detection in the memory of a defective row of memory cells, a quiesce command to the memory controller of the memory commanding the memory controller to clear the queue of memory transactions awaiting execution by the memory controller and to block memory transactions awaiting execution by the memory controller.

In Example 33, the subject matter of Examples 28-36 (excluding the present Example) can optionally include wherein the BIOS is configured to reserve a memory space in the computer system during booting of the computer system and wherein the error handler routine of the BIOS is further configured to preserve defective row data of the defective row of memory cells in the reserved memory space and restore defective row data from the reserved memory space to a replacement row of memory cells selected to replace the defective row of memory cells.

In Example 34, the subject matter of Examples 28-36 (excluding the present Example) can optionally include wherein the repair request sent by the BIOS is a volatile repair request to the memory controller of the memory to command the memory to replace the defective row of memory cells with a replacement row of memory cells in a volatile repair, and wherein the error handler routine of the BIOS is further configured to send an unquiesce command to the memory controller of the memory and to cause the processor logic means to switch from the second runtime system maintenance mode back to the first runtime operating system mode in response to a second interrupt to the processor logic means generated by the memory controller following completion of the volatile repair.

In Example 35, the subject matter of Examples 28-36 (excluding the present Example) can optionally include wherein the repair request sent by the BIOS is a nonvolatile repair request to the memory controller of the memory to command the memory to replace the defective row of memory cells with a replacement row of memory cells in a nonvolatile repair, and wherein the error handler routine of the BIOS is further configured to cause the processor logic means to switch from the second runtime system maintenance mode back to the first runtime operating system mode following sending of the nonvolatile repair request, wherein the processor logic means is further configured to switch from the first runtime operating system mode back to the second runtime system maintenance mode back in response to a second interrupt to the processor logic means generated by the memory controller following completion of the nonvolatile repair, and wherein the error handler routine of the BIOS is further configured to send an unquiesce command to the memory controller of the memory and to cause the processor logic means to switch from the second runtime system maintenance mode back to the first runtime operating system mode in response to the second interrupt to the processor logic means generated by the memory controller following completion of the nonvolatile repair.

In Example 36, the subject matter of Examples 28-36 (excluding the present Example) can optionally include a system, said system comprising: said processor logic means and said memory, and at least one of a display communicatively coupled to the processor logic means, a network interface communicatively coupled to the processor logic means, and a battery coupled to provide power to the system.

Example 37 is a computer program product for a computing system having a memory having rows of memory cells, and an operating system, wherein the computer program product comprises a computer readable storage medium having program instructions embodied therewith, the program instructions executable by a processor of the computing system to cause operations, the operations comprising: executing an operating system in a computer system, detecting in a memory of the computer system, a defective row of memory cells having at least one defective cell, in response to the detecting, interrupting the operating system of the computer system and replacing the defective row of memory cells with a spare row of memory cells as a replacement row of memory cells, and resuming execution of the operating system.

In Example 38, the subject matter of Examples 37-44 (excluding the present Example) can optionally include wherein the computer system includes a processor having a first runtime operating system mode in which the operating system executes, and a second runtime system maintenance mode in which an error handler routine executes to replace the defective row of memory cells with a replacement row of memory cells, and wherein the interrupting the operating system of the computer system includes a memory controller of the memory generating a first interrupt to the processor, and the replacing the defective row of memory cells with a replacement row of memory cells includes the processor switching from the first runtime operating system mode to the second runtime system maintenance mode in response to the first interrupt from the memory controller.

In Example 39, the subject matter of Examples 37-44 (excluding the present Example) can optionally include wherein a Basic Input/Output System (BIOS) executes in the second runtime system maintenance mode and wherein the BIOS includes the error handler routine.

In Example 40, the subject matter of Examples 37-44 (excluding the present Example) can optionally include wherein the replacing the defective row of memory cells with a replacement row of memory cells includes the error handler routine of the BIOS sending a repair request to the memory controller of the memory to command the memory to replace the defective row of memory cells with a replacement row of memory cells.

In Example 41, the subject matter of Examples 37-44 (excluding the present Example) can optionally include wherein the replacing the defective row of memory cells with a replacement row of memory cells includes the error handler routine of the BIOS sending a quiesce command to the memory controller of the memory commanding the memory controller to clear a queue of memory transactions awaiting execution by the memory controller.

In Example 42, the subject matter of Examples 37-44 (excluding the present Example) can optionally include wherein the operations further comprise the error handler routine of the BIOS preserving defective row data of the defective row of memory cells in a reserved memory space and restoring defective row data from the reserved memory space and to the replacement row of memory cells following completion of the replacement of the defective row of memory cells.

In Example 43, the subject matter of Examples 37-44 (excluding the present Example) can optionally include wherein the repair request sent by the BIOS is a volatile repair request to the memory controller of the memory to command the memory to replace the defective row of memory cells with a replacement row of memory cells in a volatile repair, and wherein the operations further comprise following completion of the volatile repair, the memory controller of the memory generating a second interrupt to the processor, and in response to the second interrupt, the error handler routine of the BIOS sending an unquiesce command to the memory controller of the memory and the processor switching from the second runtime system maintenance mode back to the first runtime operating system mode.

In Example 44, the subject matter of Examples 37-44 (excluding the present Example) can optionally include wherein the repair request sent by the BIOS is a nonvolatile repair request to the memory controller of the memory to command the memory to replace the defective row of memory cells with a replacement row of memory cells in a nonvolatile repair, and wherein the operations further comprise following sending of the nonvolatile repair request, the error handler routine of the BIOS causing the processor to switch from the second runtime system maintenance mode back to the first runtime operating system mode, and, the memory controller of the memory generating a second interrupt to the processor upon completion of the nonvolatile repair, and in response to the second interrupt, the processor switching back to the second runtime system maintenance mode in which the error handler routine of the BIOS sends an unquiesce command to the memory controller of the memory and causes the processor to switch from the second runtime system maintenance mode back to the first runtime operating system mode.

All optional features of any of the systems and/or apparatus described above may also be implemented with respect to the method or process described above, and specifics in the examples may be used anywhere in one or more embodiments. Additionally, all optional features of the method or process described above may also be implemented with respect to any of the system and/or apparatus described above, and specifics in the examples may be used anywhere in one or more embodiments.

What is claimed is:

1. An apparatus for use with a computer system, the computer system having a memory and a memory controller, the memory including a plurality of rows of cells including at least one spare row of cells, the apparatus comprising:
   a cache to store instructions; and
   processor logic configured to:
   in response to detection in the memory of a defective row of memory cells having at least one defective cell, initiate replacement of the detected defective row with the at least one spare row as a replacement row, including to cause a volatile repair request to be sent to the memory to replace the defective row with the replacement row and switch from a first runtime operating system mode to a second runtime system maintenance mode in response to a first interrupt, wherein the first interrupt is to be generated in response to the detection of the defective row;
   in response to the first interrupt, send a quiesce command to the memory controller to clear a queue of memory transactions awaiting execution and to block memory transactions awaiting execution, and
   in response to a second interrupt following completion of the volatile repair request, send an unquiesce command to the memory controller to cause the processor logic to switch from the second runtime system maintenance mode back to the first runtime operating system mode.

2. The apparatus of claim 1, wherein the processor logic is further configured to have the first runtime operating system mode in which an operating system executes, and the second runtime system maintenance mode in which an error handler routine executes to initiate replacement of the defective row of memory cells with the replacement row.

3. The apparatus of claim 2 wherein the processor logic is further configured to execute a Basic Input/Output System (BIOS) in the second runtime system maintenance mode and wherein the BIOS includes the error handler routine configured to be executed in response to a first interrupt from the memory controller generated in response to detection in the memory of a defective row of memory cells.

4. The apparatus of claim 3, wherein the error handler routine of the BIOS is configured to send in response to the first interrupt, a repair request to command the memory to replace the defective row with the replacement row.

5. The apparatus of claim 4, wherein the memory controller is configured to maintain the queue of memory transactions awaiting execution by the memory controller.

6. The apparatus of claim 4, wherein the BIOS is configured to reserve a memory space in the computer system during booting of the computer system and wherein the error handler routine of the BIOS is further configured to preserve data of the defective row in the reserved memory space and restore data of the defective row from the reserved memory space to the replacement row.

7. A method, comprising:
executing an operating system in a computer system;
detecting in a memory of the computer system, a defective row of memory cells having at least one defective cell;
in response to detecting the defective row:
generating a first interrupt,
in response to the first interrupt, interrupting the operating system of the computer system, and
replacing the defective row with a spare row as a replacement row, including:
causing a volatile repair request to be sent to the memory to replace the defective row with the replacement row,
switching from a first runtime operating system mode to a second runtime system maintenance mode in response to a first interrupt,
sending a quiesce command to clear a queue of memory transactions awaiting execution and blocking memory transactions awaiting execution, and
generating a second interrupt following completion of the volatile repair request, and
in response to the second interrupt, sending an unquiesce command causing a switch from the second runtime system maintenance mode back to the first runtime operating system mode; and
resuming execution of the operating system.

8. The method of claim 7, wherein the computer system includes a processor having the first runtime operating system mode in which the operating system executes, and the second runtime system maintenance mode in which an error handler routine executes to replace the defective row with a replacement row, and wherein the interrupting the operating system of the computer system includes a memory controller generating a first interrupt to the processor, and replacing the defective row of memory cells with a replacement row of memory cells includes the processor switching from the first runtime operating system mode to the second runtime system maintenance mode in response to the first interrupt from the memory controller.

9. The method of claim 8 wherein a Basic Input/Output System (BIOS) executes in the second runtime system maintenance mode and wherein the BIOS includes the error handler routine.

10. The method of claim 9, wherein the replacing the defective row with a replacement row of memory cells includes the error handler routine of the BIOS sending a repair request to command the memory to replace the defective row of memory cells with a replacement row of memory cells.

11. The method of claim 10, wherein the replacing the defective row with a replacement row includes the error handler routine of the BIOS sending a quiesce command to the memory controller commanding the memory controller to clear a queue of memory transactions awaiting execution by the memory controller.

12. The method of claim 10, further comprising the error handler routine of the BIOS preserving data of the defective row in a reserved memory space and restoring data of the defective row from the reserved memory space and to the replacement row.

13. A computer system, comprising:
a memory having a memory controller and a plurality of rows of cells including at least one spare row of cells; and
processor logic to:
in response to detection in the memory of a defective row of memory cells having at least one defective cell, initiate replacement of the detected defective row with the at least one spare row as a replacement row, including to cause a volatile repair request to be sent to the memory to replace the defective row with the replacement row and switch from a first runtime operating system mode to a second runtime system maintenance mode in response to a first interrupt, wherein the first interrupt is to be generated in response to the detection of the defective row,
in response to the first interrupt, send a quiesce command to the memory controller to clear a queue of memory transactions awaiting execution and to block memory transactions awaiting execution, and
in response to a second interrupt following completion of the volatile repair request, send an unquiesce command to the memory controller to cause the processor logic to switch from the second runtime system maintenance mode back to the first runtime operating system mode.

14. The computer system of claim 13, wherein the processor logic is further to have the first runtime operating system mode in which an operating system executes, and the second runtime system maintenance mode in which an error handler routine executes to initiate replacement of the defective row with a replacement row.

15. The computer system of claim 14, wherein the processor logic is further to execute a Basic Input/Output System (BIOS) in the second runtime system maintenance mode and wherein the BIOS includes the error handler routine configured to be executed in response to the first interrupt from the memory controller generated in response to detection in the memory of a defective row.

16. The computer system of claim 15, wherein the error handler routine of the BIOS is configured to send in response to the first interrupt from the memory controller generated in response to detection in the memory of a defective row, a repair request to command the memory to replace the defective row with a replacement row.

17. The computer system of claim 16, wherein the memory controller is to maintain the queue of memory transactions awaiting execution by the memory controller.

18. The computer system of claim 16, wherein the BIOS is configured to reserve a memory space in the computer system during booting of the computer system and wherein the error handler routine of the BIOS is further configured to preserve data of the defective row in the reserved memory space and restore data of the defective row from the reserved memory space to the replacement row.

* * * * *